(12) United States Patent
Hollis et al.

(10) Patent No.: US 10,297,294 B2
(45) Date of Patent: *May 21, 2019

(54) APPARATUSES AND METHODS FOR PERFORMING INTRA-MODULE DATABUS INVERSION OPERATIONS

(71) Applicant: MICRON TECHNOLOGY, INC., Boise, ID (US)

(72) Inventors: Timothy M. Hollis, Meridian, ID (US); Huy T. Vo, Boise, ID (US); Dirgha Khatri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/703,365

(22) Filed: Sep. 13, 2017

(65) Prior Publication Data
US 2018/0005671 A1 Jan. 4, 2018

Related U.S. Application Data

(63) Continuation of application No. 15/159,728, filed on May 19, 2016, now Pat. No. 9,922,686.

(51) Int. Cl.
*G11C 7/10* (2006.01)
*G11C 7/22* (2006.01)
*G11C 5/04* (2006.01)

(52) U.S. Cl.
CPC .................. *G11C 7/10* (2013.01); *G11C 5/04* (2013.01); *G11C 7/1006* (2013.01); *G11C 7/22* (2013.01)

(58) Field of Classification Search
CPC ........... G11C 7/10; G11C 7/22; G11C 7/1006; G11C 5/04
See application file for complete search history.

(56) References Cited

U.S. PATENT DOCUMENTS

| | | |
|---|---|---|
| 4,365,247 A | 12/1982 | Bargeton et al. |
| 5,331,320 A | 7/1994 | Cideciyan et al. |
| 6,032,248 A | 2/2000 | Curry et al. |
| 6,115,301 A | 9/2000 | Namekawa |
| 6,333,915 B1 | 12/2001 | Fujita |
| 6,518,893 B1 | 2/2003 | Robinson |
| 6,584,526 B1 | 6/2003 | Bogin et al. |

(Continued)

FOREIGN PATENT DOCUMENTS

| | | |
|---|---|---|
| JP | 11-283396 | 10/1999 |
| WO | 2014151637 A1 | 9/2014 |
| WO | 2018175634 A1 | 9/2018 |

OTHER PUBLICATIONS

U.S. Appl. No. 15/159,728, filed May 2016, Hollis et al.*
(Continued)

*Primary Examiner* — Pho M Luu
(74) *Attorney, Agent, or Firm* — Dorsey & Whitney LLP

(57) ABSTRACT

Apparatuses, memory modules, and methods for performing intra-module data bus inversion operations are described. An example apparatus include a memory module comprising a data bus inversion (DBI) and buffer circuit and a plurality of memories. The DBI and buffer circuit configured to encode a block of data received by the memory module and to provide DBI data and a corresponding DBI bit to a respective memory of the plurality of memories.

20 Claims, 5 Drawing Sheets

(56) References Cited

U.S. PATENT DOCUMENTS

| | | | |
|---|---|---|---|
| 6,741,190 B2 | 5/2004 | Henkel et al. |
| 6,844,833 B2 | 1/2005 | Cornelious et al. |
| 7,113,550 B2 | 9/2006 | Stonecypher et al. |
| 7,280,412 B2 | 10/2007 | Tang et al. |
| 7,405,981 B2 | 7/2008 | Dietrich |
| 7,405,984 B2 | 7/2008 | Hughes |
| 7,501,963 B1 | 3/2009 | Hollis |
| 7,616,133 B2 | 11/2009 | Hollis |
| 7,701,368 B2 | 4/2010 | Hollis |
| 8,014,196 B2 | 9/2011 | Graef |
| 8,018,358 B2 | 9/2011 | Hollis |
| 8,026,740 B2 | 9/2011 | Hollis |
| 8,094,045 B2 | 1/2012 | Hollis |
| 8,207,796 B2 | 6/2012 | Mangaiahgari |
| 8,207,976 B2 | 6/2012 | Hein |
| 8,762,813 B2 | 6/2014 | Tang et al. |
| 8,766,828 B2 | 7/2014 | Hollis |
| 8,826,101 B2 | 9/2014 | Hargan |
| 8,854,236 B2 | 10/2014 | Hollis |
| 8,879,654 B2 | 11/2014 | Hollis |
| 9,025,409 B2 | 5/2015 | Shaeffer |
| 9,048,856 B2 | 6/2015 | Hollis |
| 9,091,727 B1 | 7/2015 | Lupu et al. |
| 9,116,828 B2 * | 8/2015 | Hollis ................. G06F 11/1008 |
| 9,148,170 B2 | 9/2015 | Hollis |
| 9,268,719 B2 | 2/2016 | Shaeffer |
| 9,405,721 B2 * | 8/2016 | Ayyapureddi ...... G06F 13/4221 |
| 9,798,693 B2 | 10/2017 | Hollis |
| 2002/0156953 A1 | 10/2002 | Beiley et al. |
| 2003/0170020 A1 | 9/2003 | Chaudhuri et al. |
| 2004/0109509 A1 | 6/2004 | Stonecypher et al. |
| 2004/0135709 A1 | 7/2004 | Cornelius et al. |
| 2005/0288642 A1 | 12/2005 | Kim |
| 2005/0289435 A1 | 12/2005 | Mulla et al. |
| 2007/0008008 A1 | 1/2007 | Kwack et al. |
| 2007/0096950 A1 | 5/2007 | Yang et al. |
| 2008/0019451 A1 | 1/2008 | Jang et al. |
| 2008/0225603 A1 | 9/2008 | Hein |
| 2009/0179782 A1 | 7/2009 | Hollis |
| 2009/0182918 A1 | 7/2009 | Hollis |
| 2009/0190690 A1 | 7/2009 | Kuwata |
| 2009/0238300 A1 | 9/2009 | Hollis |
| 2009/0274245 A1 | 11/2009 | Brown et al. |
| 2009/0313521 A1 | 12/2009 | Hollis |
| 2010/0026533 A1 | 2/2010 | Hollis |
| 2010/0027989 A1 | 2/2010 | Lewis et al. |
| 2010/0042889 A1 | 2/2010 | Hargan |
| 2010/0199017 A1 | 8/2010 | Hollis |
| 2011/0018517 A1 | 1/2011 | Candage et al. |
| 2011/0116786 A1 | 5/2011 | Wellbrock et al. |
| 2011/0222623 A1 | 9/2011 | Hollis |
| 2011/0252171 A1 | 10/2011 | Dearth et al. |
| 2011/0316726 A1 | 12/2011 | Hollis |
| 2012/0131244 A1 | 5/2012 | Abbasfar |
| 2012/0195131 A1 | 8/2012 | Pax |
| 2012/0206280 A1 | 8/2012 | Abbasfar et al. |
| 2013/0091327 A1 | 4/2013 | Shido et al. |
| 2013/0307708 A1 | 11/2013 | Hollis |
| 2014/0053040 A1 | 2/2014 | Hargan |
| 2014/0281075 A1 | 9/2014 | Hollis |
| 2014/0289440 A1 | 9/2014 | Shu |
| 2014/0289460 A1 | 9/2014 | Shu et al. |
| 2014/0313062 A1 | 10/2014 | Hollis |
| 2015/0022383 A1 | 1/2015 | Hollis |
| 2015/0227417 A1 | 8/2015 | Kim |
| 2015/0229325 A1 | 8/2015 | Hollis |
| 2015/0287446 A1 | 10/2015 | Hong |
| 2015/0356047 A1 | 12/2015 | Ayyapureddi et al. |
| 2016/0173128 A1 | 6/2016 | Ware et al. |
| 2018/0277175 A1 | 9/2018 | Kondo et al. |

OTHER PUBLICATIONS

First Office Action for TW Application No. 106116370, dated Mar. 5, 2018.

International Search Report and Written Opinion dated Jul. 24, 2017 for PCT application No. PCT/US2017/032019.

U.S. Appl. No. 15/468,742, entitled: "Semiconductor Layered Device With Data Bus" filed Mar. 24, 2017.

Unpublished U.S. Appl. No. 15/233,821, filed Aug. 10, 2016.

Cheng, et al., ""Memory bus encoding for low power: a tutorial"", Quality Electronic Design, 2001 International Symposium on Mar. 26-28, 2001, Piscataway, NJ, USA, IEEE Mar. 26, 2001, pp. 199-204.

Hollis, "Data Bus Inversion in High-Speed Memory Applications", IEEE Transactions on Circuits and Systems —II Express Briefs vol. 56, No. 4, Apr. 2009.

Rokhani, et al., "Low-Power Bus Transform Coding for Multilevel Signals", IEEE Asia Pacific Conference on Circuits and Systems, Dec. 2006, 1272-1275.

Shin, Youngsoo et al., "Partial Bus-Invert Coding for Power Optimization of Application-Specific Systems", IEEE Transactions on Very Large Scale Integration (VLSI) Systems, vol. 9, No. 2, Apr. 2001.

Stan, et al., "Bus-Invert Coding for Low-Power I/O", IEEE Transactions on Very Large Scale Integration, vol. 3, No. 1, Mar. 1995, 49-58.

U.S. Appl. No. 16/150,505, titled "Semiconductor Layered Device With Data Bus", filed Oct. 3, 2018.

* cited by examiner

APPARATUSES AND METHODS FOR PERFORMING INTRA-MODULE DATABUS INVERSION OPERATIONS

CROSS-REFERENCE TO RELATED APPLICATION

This application is a continuation of U.S. patent application Ser. No. 15/159,728, filed May 19, 2016. This application is incorporated by reference herein in its entirety and for all purposes.

DESCRIPTION OF RELATED ART

Advances in technology have resulted in making electronic devices smaller and faster, while consuming less power. Transmission of data over signal lines encompasses a large amount of the power consumption in an electronic device. One way to reduce power consumption while communicating data between a memory controller and a memory module is using data bus inversion (DBI). A DBI operation determines, over a number of signal lines, whether to transmit unmodified data or inverted data. Transmitting unmodified data or inverted data may reduce power consumption on the signal lines. The DBI operation may use a DBI bit to indicate to the receiver whether data is inverted. The inverted data may be inverted again at the receiving end based on the DBI bit so that the data is correctly interpreted. However, DBI operations are generally limited to communication between a memory controller and a memory module, especially in certain configurations.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
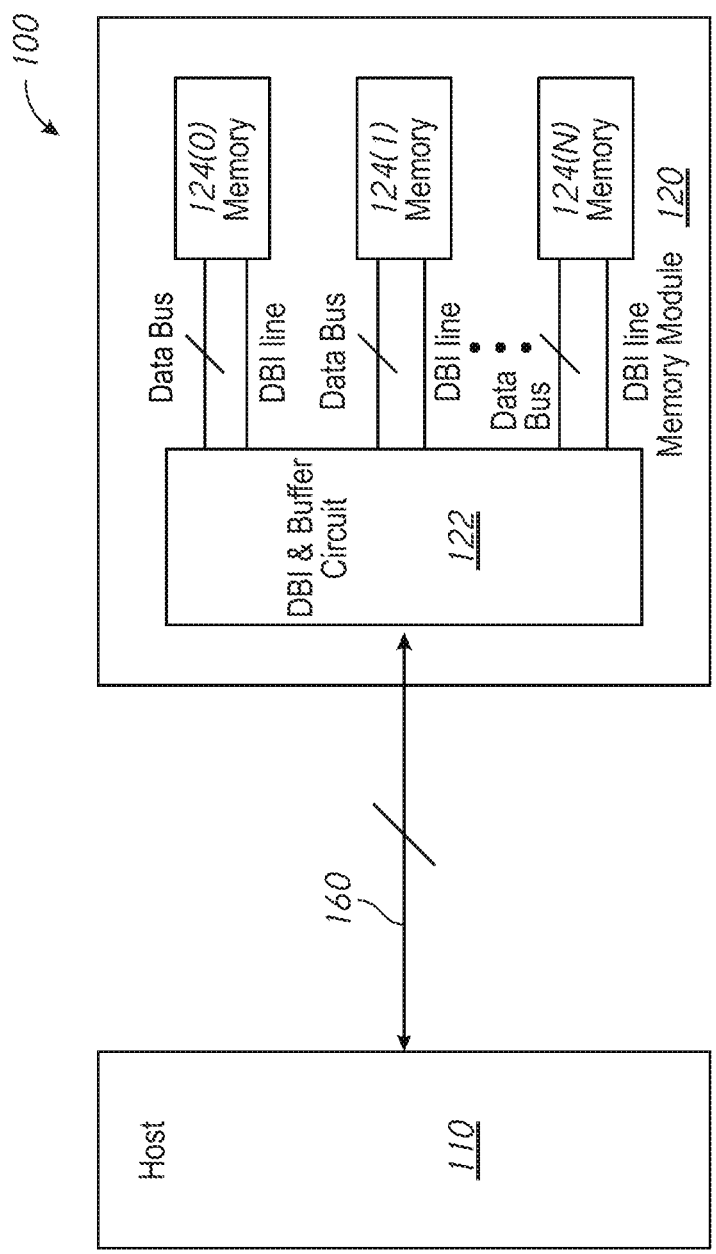
FIG. 1 is a diagram of a particular illustrative embodiment of an apparatus including a memory module configured to perform a DBI operation, according to an embodiment of the disclosure.

Referring to FIG. 1, a particular illustrative embodiment of an apparatus (e.g., an integrated circuit, a memory device, a memory system, an electronic device or system, a smart phone, a tablet, a computer, a server, etc.) including a DBI and buffer circuit 122 is disclosed and generally designated apparatus 100. The apparatus 100 may include a host 110 coupled to a memory module 120 via a data bus 160. The memory module 120 may include the DBI and buffer circuit 122 coupled to memories 124(0-N) via respective data buses and DBI lines.

The memory module 120 may be configured to provide data to and receive data from the host 110 via the data bus 160. The memory module 120 may also receive commands, addresses, and clock data from host 110 to store or retrieve the data, or command a refresh of the memories 124(0-N) on the memory module 120. The memory module 120 may be a dual in-line memory module. In some examples, the memory module 120 may be a load reduced DIMM (LRDIMM). Each of the memories 124(0-N) may be volatile memory (e.g., DRAM, SDRAM, etc.) or non-volatile memory (e.g., NAND or NOR flash, PCM, etc.). Each of the memories 124(0-N) may be double data rate (DDR) memory, such as DDR3 or DDR4 in some embodiments.

The DBI and buffer circuit 122 of the memory module 120 may receive the data from the host 110 and provide the data to the memories 124(0-N). The DBI and buffer circuit 122 of the memory module 120 may also receive the commands, addresses, and clock data from the host 110 to be provided to the memories 124(0-N). The data may be divided into blocks based on a bus width of the data bus between the DBI and buffer circuit 122 and each of the memories 124(0-N). For example, the memory module 120 may be a x4 configuration, such that the bus width of the data bus between the DBI and buffer circuit 122 and the memories 124(0-N) may be 4 bits. Other memory module configurations may be implemented, such as x8, x16, etc. For each block of data, the DBI and buffer circuit 122 may perform a DBI operation on the data to generate DBI data and provide the DBI data to a respective memory of the memories 124(0-N). The DBI and buffer circuit 122 may also provide a corresponding DBI bit over a respective DBI line to indicate whether the DBI data has been logically inverted. Likewise, each of the memories 124(0-N) may perform a DBI operation on a respective stored block of data to generate DBI data and may provide the DBI data to the DBI and buffer circuit 122, along with a corresponding DBI bit. In some embodiments, the DBI operations are performed in one direction for the data (unidirectional DBI operations). For example, in some embodiments, the DBI operations are performed by the DBI and buffer circuit 122 in providing data to the memories 124(0-N). The DBI data and corresponding DBI bit may be provided to the memories 124(0-N) by the DBI and buffer circuit 122, and may be stored by the memories 124(0-N) without decoding. That is, the DBI data as encoded, and the corresponding DBI bit are stored by the memories 124(0-N). When the DBI data and corresponding DBI bit are read from the memories 124(0-N), the DBI data and corresponding DBI bit may be provided from the memories 124(0-N) to the DBI and buffer circuit 122 to be decoded based on the DBI bit. The decoded data may then be provided to the host 110. In another example, for some embodiments the DBI operations are performed by the memories 124(0-N) in providing data to the DBI buffer circuit 122. In some embodiments, the DBI operations are performed in both directions for the data (bidirectional DBI operations), for example, the DBI operations are performed by the DBI and buffer circuit 122 in providing data to the memories 124(0-N) and also performed by the memories 124(0-N) in providing data to the DBI buffer circuit 122.

Different DBI operations may be performed by the DBI and buffer circuit 122 and the memories 124(0-N) without departing from the scope of the present invention. The DBI operations may be used by the DBI and buffer circuit 122 and the memories 124(0-N) to reduce power consumption. In some embodiments, the DBI operation performed by the DBI and buffer circuit 122 and the memories 124(0-N) minimizes a number of bits of a particular logic state that are provided between the DBI and buffer circuit 122 and the memories 124(0-N), such as, being based on whether a majority of the data has one state or another. For example, if a transmission over a bus includes data with all logical values that are indicated by a high voltage, it may be more power efficient to invert the data to the opposite logical value indicated by a lower voltage to reduce power consumption on the signal lines. In some embodiments, it may be more power efficient to invert the data to the opposite logical value indicated by a higher voltage to reduce power consumption on the signal line. In some embodiments, the DBI operation performed by the DBI and buffer circuit 122 and the memories 124(0-N) may be based on the number of transitions for the bits of previous data to current data. For example, if the number of bits that need to transition from a previous logic state to a current logic state exceeds a threshold (e.g., more than half of the bits will transition logic states), the data may be inverted to reduce the number of bits that need to transition from the previous logic state to the current logic state, which may reduce power consumption. In other embodiments, the DBI operation performed by the DBI buffer circuit 122 and the memories 124(0-N) may be any DBI operation currently known or later developed to reduce power consumption on the signal lines.

In operation, the host 110 may provide data to or receive data from the memory module 120 via the data bus 160. The data received from the host 110 may be encoded according to a DBI scheme or may be unmodified. When receiving data from the host 110, the DBI and buffer circuit 122 may divide the data into blocks based on a bus width of the data buses that couple the DBI and buffer circuit 122 to the memories 124(0-N). In an example, the data may be divided into nibbles (e.g., 4 bits). The DBI and buffer circuit 122 and each of the memories 124(0-N) may perform intra-module encoding and decoding DBI operations on each block of data to provide respective DBI data, which are communicated between the DBI and buffer circuit 122 and the memories 124(0-N) via the respective data buses. The DBI operation may be performed to reduce current consumption.

For example, in an embodiment where the DBI operation is based on whether a majority of the data has one state or another, Transmitting a data bit represented by a relatively a high voltage (e.g., first logical value) may take more current than transmitting a data bit represented by a relatively low voltage (e.g., second logical value). In some embodiments, the first logical value may be represented by a voltage level of a supply voltage, and the second logical value may be represented by a reference voltage, for example, ground.

In such an embodiment, to reduce current consumption, if more than half of the data bits in a block of data received from the host 110 have the first logical value, the DBI and buffer circuit 122 may encode the DBI data by logically inverting each data bit of the block of data. For example, the data bits in the block of data having the first logic value are inverted to have the second logical value (to be represented by a relatively low voltage), and the data bits in the block of data having the second logical value are inverted to have the first logical value (to be represented by a relatively high voltage). As a result, more than half of the data bits of the DBI data will have the second logical value, represented by the relatively low voltage. If half or less than half of the data bits in the block of data from the host 110 have the second logical value, the DBI and buffer circuit 122 may encode the DBI data by providing the block of data in its original state. In addition, the DBI and buffer circuit 122 may also set a DBI bit to a logical value responsive to the block of data being inverted, and to a different logical value responsive to the block of data being left in the original state. The DBI and buffer circuit 122 may provide the DBI data and corresponding DBI bit to a respective memory of the memories 124(0-N) via the corresponding data bus and DBI line, respectively. In some embodiments, the DBI operation may be configurable, such that using DBI for data communication may be selectively disabled or enabled on the memory module 120.

Responsive to receiving the DBI data and the DBI bit, the respective memory of the memories 124(0-N) may decode the DBI data using the DBI bit to recover the original block of data to be stored in the memory in its original state.

In embodiments where DBI operations are also performed by the memories 124(0-N) in providing data, either for bidirectional or unidirectional DBI operations (e.g., providing a block of data from the respective memory of the memories 124(0-N) to host 110 via the DBI and buffer circuit 122), the respective memory of the memories 124 (0-N) may encode the block of data to generate the DBI data and DBI bit, and provide the DBI data and DBI bit to the DBI and buffer circuit 122. Responsive to receiving the DBI data and the DBI bit, the DBI and buffer circuit 122 may decode the DBI data using the DBI bit to recover the original block of data. The DBI and buffer circuit 122 may then combine all of the blocks of data from the memories 124(0-N) and provide the combined data to the host 110 via a bus.

Performing a DBI operation may reduce power consumption based on reducing a number of signal lines of each bus between the DBI and buffer circuit 122 and the memories 124(0-N) that need to provide a relatively high voltage. Additionally, the use of DBI may reduce heat and noise generation during operation. In some embodiments, the relatively high voltage represents a low logical value and the relatively low voltage represents a high logical value. In other embodiments, the relatively high voltage represents a high logical value and the relatively low voltage represents a low logical value.

Figure 2:
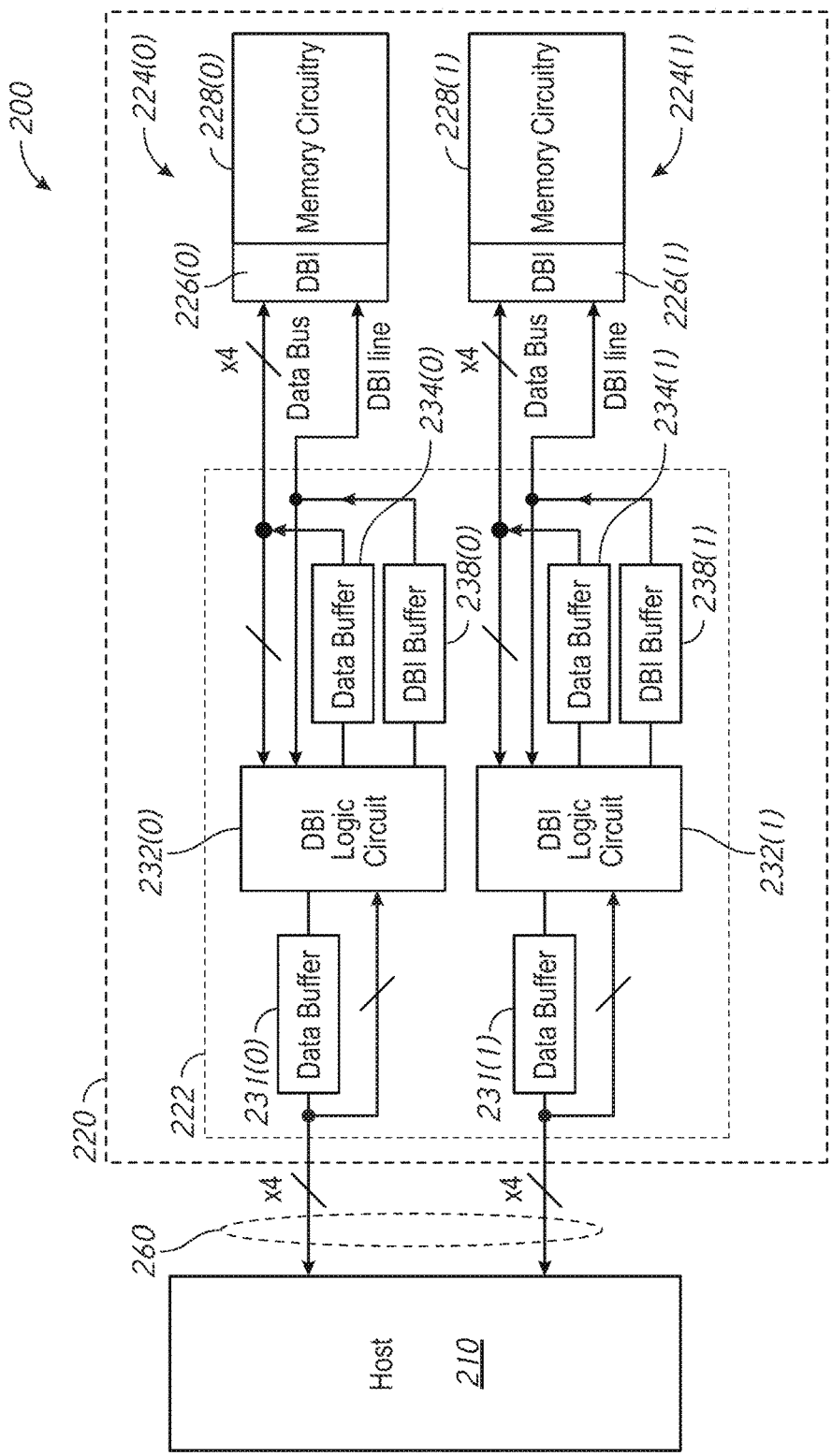
FIG. 2 is a diagram of a particular illustrative embodiment of an apparatus including a memory module configured to perform a DBI operation, according to an embodiment of the disclosure.

Referring to FIG. 2, a particular illustrative embodiment of an apparatus including a DBI and buffer circuit 222 is disclosed and generally designated apparatus 200. The apparatus 200 may include a host 210 coupled to a memory module 220 via a data bus. The memory module 220 may include a DBI and buffer circuit 222 coupled to a pair of memories 224(0-1) via data buses. The memory module 220 may be implemented in the memory module 120 of FIG. 1.

The memory module 220 may be configured to provide and receive data from the host 210 via the data bus 260. The memory module 220 may also receive commands, addresses, and clock data from the host 210 to store or retrieve the data, or command a refresh of the memories 224(0-1) on the memory module 220.

The DBI and buffer circuit 222 may receive the data from the host 210 via the data bus 260 and provide the data to the memories 224(0-1). The DBI and buffer circuit 222 of the memory module 220 may also receive the commands, addresses, and clock data from the host 210 to be provided to the memories 224(0-1). The data may be divided into blocks based on a bus width of a respective data bus between the DBI and buffer circuit 222 and each of the memories 224(0-N). For example, the memory module 120 may be a x4 configuration, such that the bus width of the bus between the DBI and buffer circuit 222 and the memories 224(0-1) is 4 bits (e.g., the block of data and the DBI data are each 4 bit wide data). Other memory module configurations may be implemented, such as x8, x16, etc. The DBI and buffer circuit 222 may include respective data buffers 231(0-1) configured to buffer data, and further include respective DBI logic circuits 232(0-1) associated with each block of data. The DBI logic circuits 232(0-1) are configured to perform intra-module DBI operations by encoding and decoding DBI data for communication with a respective memory 224(0-1). Each DBI logic circuit 232(0-1) is configured to receive and/or provide data from/to a respective data buffer 231(0-1), and also directly over the data bus 260. Each DBI logic circuit 232(0-1) is further configured to receive and/or provide DBI data from/to a respective data buffer 234(0-1) and to receive and/or provide a DBI bit from/to a respective DBI buffer 238(0-1). The data buffer 234(0-1) and the DBI buffer 238(0-1) receive and provide the DBI data and DBI bit, respectively, from/to a memory of the pair of memories 224(0-1) via a corresponding data bus and DBI line, respectively. The DBI logic circuit 232(0-1) also receives and/or provides the DBI data and the DBI bit directly from/to the data bus and the DBI line, respectively. The data buffers 234(0-1) and/or DBI buffer 238(0-1) may include bidirectional buffer circuitry that is configured to allow communication between the DBI logic circuits 232(0-1) and the memories 224(0-1) in either direction.

Each of the pair of memories 224(0-1) includes a respective DBI logic circuit 226(0-1) and memory circuitry 228(0-1). Similar to the DBI logic circuits 232(0-1) of the DBI and buffer circuit 222, the DBI logic circuits 226(0-1) of the pair of memories 224(0-1) are configured to encode and decode DBI data for communication with the DBI and buffer circuit 222. The DBI logic circuits 226(0-1) receive and provide data from/to the memory circuitry 228(0-1) during access operations.

Different DBI operations, such as those previously described, may be performed by the DBI and buffer circuit 222 and the memories 224(0-N) without departing from the scope of the present invention. In some embodiments, the DBI operations are performed in one direction for the data (unidirectional DBI operations). For example, in some embodiments, the DBI operations are performed by the DBI and buffer circuit 222 in providing data to the memories 224(0-N). In another example, for some embodiments the DBI operations are performed by the memories 224(0-N) in providing data to the DBI buffer circuit 222. In some embodiments, the DBI operations are performed in both directions for the data (bidirectional DBI operations), for example, the DBI operations are performed by the DBI and buffer circuit 222 in providing data to the memories 224(0-N) and also performed by the memories 224(0-N) in providing data to the DBI buffer circuit 222.

The memory circuitry 228(0-1) is configured to store and retrieve data for access by the host 210. The memory module 220 may be a dual in-line memory module. In some examples, the memory module 220 may be a load reduced DIMM (LRDIMM). Each of the memories 224(0-1) may be volatile memory (e.g., DRAM, SDRAM, etc.) or non-volatile memory (e.g., NAND or NOR flash, PCM, etc.). Each of the memories 224(0-1) may be double data rate (DDR) memory, such as DDR3 or DDR4.

In operation, the host 210 may provide nibbles of data to or receive nibbles of data from the memory module 220 via the data bus 260. The data received from the host 210 may be encoded by the DBI and buffer circuit 222 according to a DBI scheme or may be unmodified for the memories 224(0-1). The DBI and buffer circuit 222 and each of the memories 224(0-1) may perform intra-module DBI operations by encoding and decoding each nibble of data to provide DBI data using the DBI logic circuits 232(0-1) and the DBI logic circuits 226(0-1), respectively. The DBI operation may be performed to reduce current consumption.

For example, in an embodiment where the DBI operation is based on whether a majority of the data has one state or another, each DBI logic circuit 232(0-1) determines whether more than half of the bits of the respective nibble of data received from the host 210 via the data bus 260 have a relatively high voltage, and if so, may encode the DBI data by logically inverting each data bit of the nibble of data to provide the DBI data. For example, the data bits in the block of data having the first logic value are inverted to have the second logical value (to be represented by a relatively low voltage), and the data bits in the block of data having the second logical value are inverted to have the first logical value (to be represented by a relatively high voltage). As a result, more than half of the data bits of the DBI data will have the second logical value, represented by the relatively low voltage. If half or less than half of the data bits in the block of data from the host 110 have the second logical value, each DBI logic circuit 232(0-1) may provide the block of data as the DBI data. In addition, each DBI logic circuit 232(0-1) may also set a DBI bit to a first logical value responsive to the block of data being inverted, and to a second logical value responsive to the block of data being left in the original state.

Each DBI logic circuit 232(0-1) may provide the DBI data and corresponding DBI bit to a data buffer 234(0-1) and DBI buffer 238(0-1), respectively, and to the data bus and the DBI line. The DBI data and the DBI bit may be provided to a memory of the pair of memories 224(0-N) via the corresponding data bus and DBI line, respectively, from the data buffer 234(0-1) and DBI buffer 238(0-1), and from the DBI logic circuit 232(0-1).

Responsive to receiving the DBI data and the DBI bit, the DBI logic circuits 226(0-1) may decode the DBI data using the DBI bit to recover the original nibble of data. The nibble of data may be provided to the memory circuitry 228(0-1) for storage.

In embodiments where DBI operations are also performed by the memories 124(0-N) in providing data, either for bidirectional or unidirectional DBI operations (e.g., providing a nibble of data from the respective memory of the memories 224(0-N) to the host 210 via the DBI and buffer circuit 222), the respective the DBI logic circuit 226(0-1) may encode the nibble of data to provide the DBI data and a corresponding DBI bit, and provide the DBI data and DBI bit to the respective data buffer 234(0-1) and DBI buffer 238(0-1), and to the DBI and buffer circuit 222, via the corresponding data bus and DBI line. Responsive to receiving the DBI data and the DBI bit, the data buffers 234(0-1) and DBI buffers 238(0-1) may provide the DBI data and the DBI bit to the respective DBI logic circuit 232(0-1), which may decode the DBI data using the DBI bit to recover the original nibble of data. The DBI and buffer circuit 222 may provide the DBI nibble to the host 210 via the data buffer 231(0-1) and the data bus 260.

Each of the DBI logic circuits 232(0-1) and the DBI logic circuits 226(0-1) may include logic to determine whether a majority of the bits have a logic level represented by a relatively high voltage, such as XOR gates or other logic. As previously discussed, performing a DBI operation may reduce power consumption based on the reduction of a number of signal lines of each bus between the DBI and buffer circuit 222 and the memories 224(0-1) that need to provide a relatively high voltage. Additionally, the use of DBI may also reduce heat generation during operation. While FIG. 2 depicts a pair of memories 224(0-1), the apparatus may be modified to include any number of memories, such as 4, 8, 16, etc. A count of DBI logic circuits, data buffers, and DBI buffers of the DBI and buffer circuit 222 may match a count of the memories. Further, while the data bus between the host 210 and the memory module 220 indicates a x4 configuration, other configurations may be implemented, such as x8, x16, etc.

Figure 3:
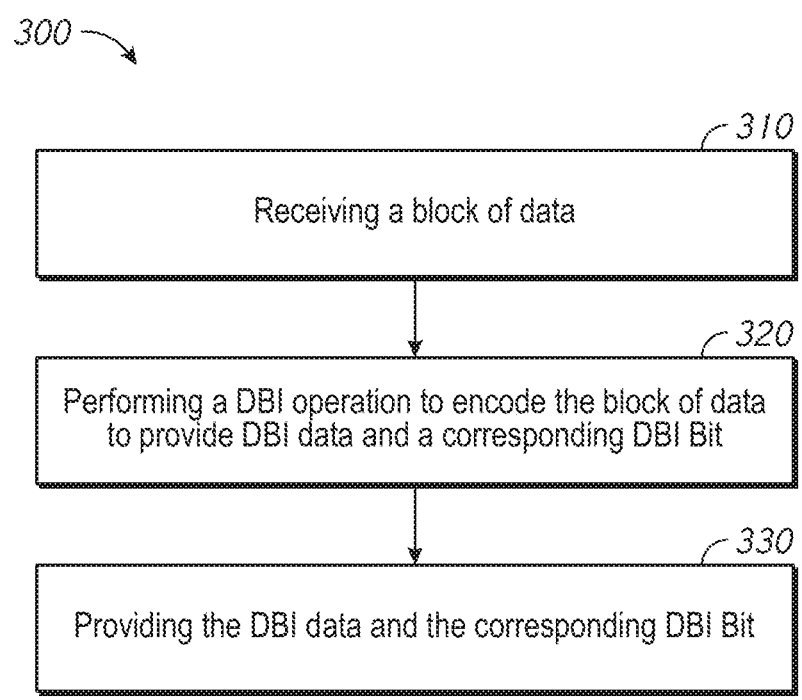
FIG. 3 is a flowchart of a method for performing DBI operations for data communication on a memory module according to an embodiment of the disclosure.
Figure 4:
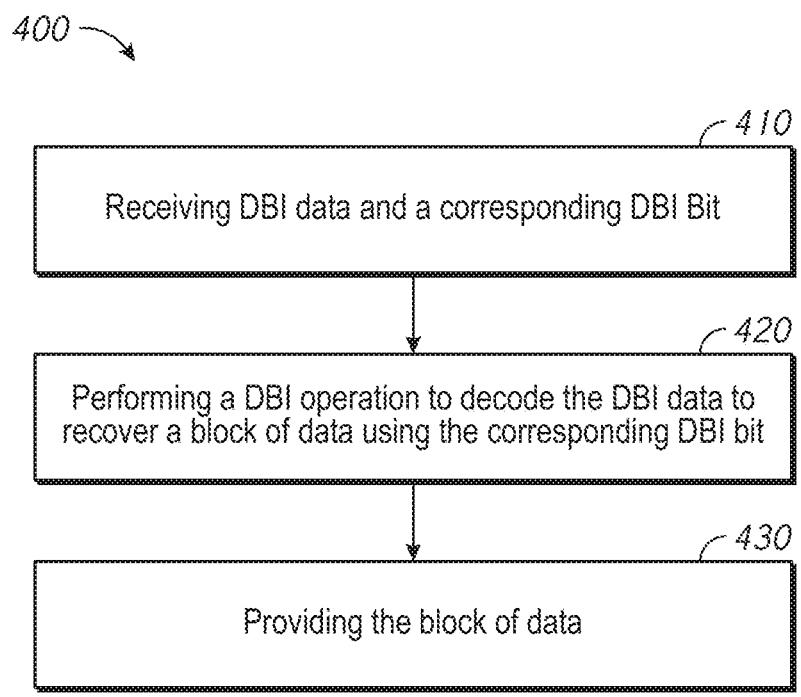
FIG. 4 is a flowchart of a method for performing DBI operations for data communication on a memory module according to an embodiment of the disclosure.

FIG. 3 is a flowchart 300 for a method for performing DBI encoding operations for intra-module data communication on a memory module according to an embodiment of the disclosure. FIG. 4 is a flowchart 400 for a method for performing DBI decoding operations for intra-module data communication on the memory module according to an embodiment of the disclosure The methods illustrated by the flowchart 300 and flowchart 400 may be implemented by the memory module 120 of FIG. 1 and/or the memory module 220 of FIG. 2, or any combination thereof.

The method 300 may include receiving a block of data, at 310. The block of data may be received from a host, such as the host 110 of FIG. 1 or the host 210 of FIG. 2 at a memory module, such as the memory module 120 of FIG. 1 or the memory module 220 of FIG. 2, or may be retrieved from a memory of a memory module, such as one of the memories 124(0-N) of FIG. 1 or one of the memories 224(0-1) of FIG. 2. The memory module may be a x4 memory module, and thus the block of data may be four bits. Several blocks of data may be received at or retrieved from the memory module in parallel, and the aggregate of the blocks of data may be combined to form a single piece of information.

The method 300 may further include performing a DBI operation to encode the block of data to provide DBI data and a corresponding DBI bit, at 320. The encoding DBI operation may be performed by a DBI and buffer circuit, such as the DBI and buffer circuit 122 of FIG. 1 or the DBI and buffer circuit 222 of FIG. 2, or by a memory, such as the one of the memories 124(0-N) of FIG. 1 or one of the DBI logic circuit 226(0-1) of FIG. 2. For example, in an embodiment having a DBI operation based on whether a majority of the data has one state or another, The DBI operation may include determining whether more than half of the bits of the block of data have a logical level corresponding to a relatively high voltage, and responsive to more than half of the bits of the block of data having the logical level corresponding to the relatively high voltage, inverting the bits of the block of data. Inverting the bits of the block of data when more than half of the bits of the block of data have the logical level corresponding to the relatively high voltage may reduce power when communicating the data. The DBI operation may further include setting the corresponding DBI bit responsive to more than half of the bits of the block of data having the logical level corresponding to the relatively high voltage. The DBI bit is used to decode the DBI data to recover the original block of data on the receiving end.

The method 300 may further include providing the DBI data and the corresponding DBI bit, at 330. The DBI data and the corresponding DBI bit may be provided from the DBI and buffer circuit to a memory, or from the memory to the DBI and buffer circuit. The memories may be non-volatile memories, such as DRAM, and the memory module may be an LRDIMM module. In some examples, the method 300 may further include performing an encoding DBI operation on a plurality of blocks of data in parallel to provide respective DBI data and corresponding DBI bits at a memory module. The method 300 may further include providing each respective DBI data and corresponding DBI bits to or from a respective one of the plurality of memories from or to the DBI and buffer circuit, respectively.

Turning now to FIG. 4, the method 400 may include receiving DBI data and a DBI bit, at 410. The DBI data and the DBI bit may be received at a DBI and buffer circuit, such as the DBI and buffer circuit 122 of FIG. 1 or the DBI and buffer circuit 222 of FIG. 2, or may be received at a memory, such as one of the memories 124(0-N) of FIG. 1 or one of the memories 224(0-1) of FIG. 2.

The method 400 may further include performing a decoding DBI operation on the DBI data using the corresponding DBI bit to recover the block of data. The decoding DBI operation may be performed by the DBI and buffer circuit, or by the memory.

The method 400 may further include providing the block of data, at 430. The block of data may be provided from the DBI and buffer circuit to a host, such as the host 110 of FIG. 1 or the host 210 of FIG. 2, or may be provided to memory circuitry for storage, such as memory circuitry on one of the memories 124(0-N) of FIG. 1 and/or memory circuitry 228(0-1) of one of the memories 224(0-1) of Figure.

The above description for flowcharts 300 and 400 may allow for intra-module DBI operations (e.g., in either direction) between a DBI and buffer circuit and one or more of the respective memories. The intra-module DBI operations may reduce memory module power consumption by reducing current required for intra-module communication.

Figure 5:
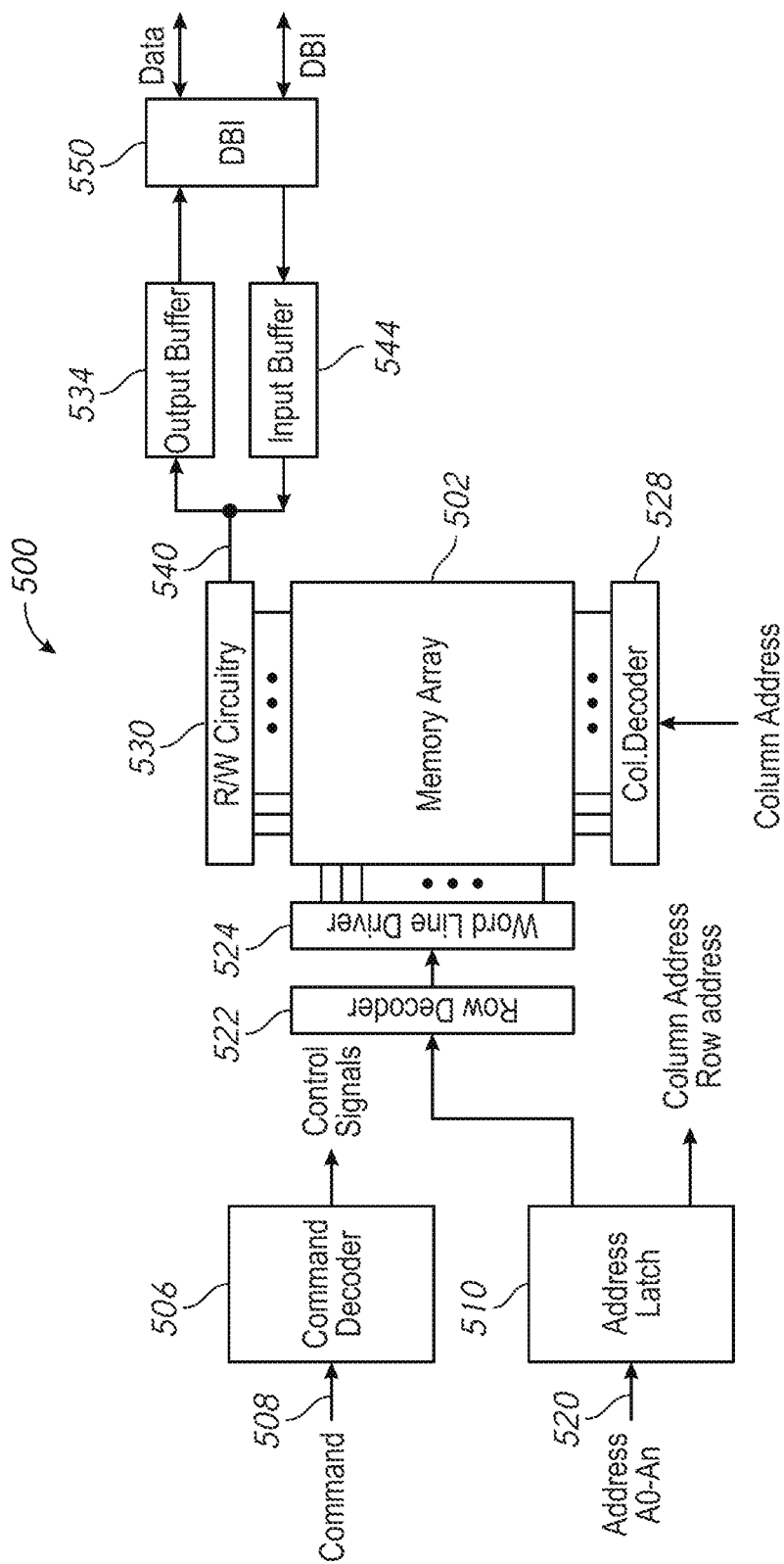
FIG. 5 is a diagram of a particular illustrative embodiment of a memory including a DBI logic circuit, according to an embodiment of the disclosure.

FIG. 5 illustrates a portion of a memory 500 according to an embodiment of the present disclosure. The memory 500 includes a memory array 502 of memory cells, which may be, for example, volatile memory cells (e.g., DRAM memory cells, SRAM memory cells), non-volatile memory cells (e.g., flash memory cells, phase change memory cells), or some other types of memory cells. The memory 500 includes a command decoder 506 that receives memory commands through a command bus 508 and generates corresponding control signals within the memory 500 to carry out various memory operations. Row and column address signals are applied to the memory 500 through an address bus 520 and provided to an address latch 510. The address latch then outputs a separate column address and a separate row address.

The row and column addresses are provided by the address latch 510 to a row decoder 522 and a column address decoder 528, respectively. The column address decoder 528 selects bit lines extending through the memory array 502 corresponding to respective column addresses. The row decoder 522 is connected to wordline driver 524 that activates respective rows of memory cells in the memory array 502 corresponding to received row addresses. The selected digit line (e.g., a bit line or bit lines) corresponding to a received column address are coupled to memory circuitry 530 to provide read data to a data output circuit 534 via an output data bus 540. The data output circuit 534 is configured to provide output data to a DBI logic circuit 550, which is configured to encode the output data to provide DBI data and a corresponding DBI bit. An output pad coupled to the data DBI logic circuit 550 is used for electrically coupling to the memory 500. The DBI logic circuit 550 may also be configured to receive DBI data and a corresponding DBI bit and to decode the DBI data to provide write data. The write data are applied to the memory array 502 through a data input circuit 544 and the memory array memory circuitry 530 via an input data bus 541. An input pad coupled to the DBI logic circuit 550 is used for electrically coupling to the memory 500. The DBI logic circuit 550 may be implemented according to an embodiment of the invention. For example, the DBI logic circuit 550 may be implemented in any of the 124(0-N) of FIG. 1, any of the DBI logic circuits 226(0-1) of FIG. 2, and may be configured to implement the method 300 of FIG. 3, or combinations thereof. The command decoder 506 responds to memory commands applied to the command bus 508 to perform various operations on the memory array 502. In particular, the command decoder 506 is used to generate internal control signals to read data from and write data to the memory array 502.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
    a memory comprising a memory array and a first data bus inversion (DBI) logic circuit, the first DBI logic circuit configured to perform a DBI encoding operation and a DBI decoding operation; and
    a second DBI logic circuit coupled to the memory, the second DBI logic circuit configured to perform a DBI encoding operation and a DBI decoding operation.

2. The apparatus of claim 1, further comprising a data buffer configured to communicate a data with a host via an external terminal of the apparatus.

3. The apparatus of claim 2, wherein the second DBI logic circuit is further coupled to the external terminal without the data buffer coupled in between.

4. The apparatus of claim 1, further comprising a data buffer coupled between the second DBI logic circuit and the memory.

5. The apparatus of claim 4, wherein the second DBI logic circuit is further coupled to the memory without the data buffer coupled in between.

6. The apparatus of claim 1, further comprising a DBI buffer coupled between the second DBI logic circuit and the memory.

7. The apparatus of claim 1, wherein the first DBI logic circuit is coupled between the second DBI logic circuit and the memory array.

8. The apparatus of claim 1, wherein the apparatus is a memory module.

9. The apparatus of claim 8, the memory module is a load reduced dual in-line memory module.

10. An apparatus, comprising:
    a data bus;
    a data bus inversion (DBI) bus;
    a memory coupled to a first end of the data bus and a first end of the DBI bus, the memory comprising a memory array and a first data bus inversion (DBI) logic circuit, the first DBI logic circuit configured to perform a DBI encoding operation and a DBI decoding operation; and
    a second DBI logic circuit coupled to the second end of the data bus and a second end of the DBI bus, the second DBI logic circuit configured to perform a DBI encoding operation and a DBI decoding operation.

11. The apparatus of claim 10, further comprising;
    an external terminal;
    a data buffer coupled between the external terminal and the second DBI logic circuit.

12. The apparatus of claim 11, wherein the second DBI logic circuit is further coupled to the external terminal without the data buffer coupled in between.

13. The apparatus of claim 10, further comprising a data buffer coupled between the second DBI logic circuit and the data bus.

14. The apparatus of claim 10, further comprising a DBI buffer coupled between the second DBI logic circuit and the DBI bus.

15. The apparatus of claim 10, wherein the first DBI logic circuit is coupled between the second DBI logic circuit and the memory array.

16. The apparatus of claim 10, wherein the apparatus is a memory module.

17. The apparatus of claim 16, the memory module is a load reduced dual in-line memory module.

18. A method, comprising:
    receiving a first data from a host;
    encoding the first data by a first data bus inversion (DBI) logic circuit to produce a first encoded data and a first DBI bit;
    receiving the first encoded data and the first DBI bit by a memory;
    decoding the first encoded data based on the first DBI bit by a second DBI logic circuit in the memory;
    encoding a second data stored in the memory array by the second DBI logic circuit to produce a second encoded data and a second DBI bit;
    receiving the second encoded data and the second DBI bit by the first DBI logic circuit; and
    decoding the second encoded data based on the second DBI bit by the first DBI logic circuit to produce a decoded second encoded data.

19. The method of claim 18, further comprising:
    after encoding the first data by the first DBI logic circuit to produce the first encoded data and the first DBI bit, storing the first encoded data and the first DBI data into a data buffer and a DBI buffer respectively.

20. The method of claim 19, wherein the receiving the first data from the host comprises receiving the first data at an external terminal of a memory module.

* * * * *